Figure 1:
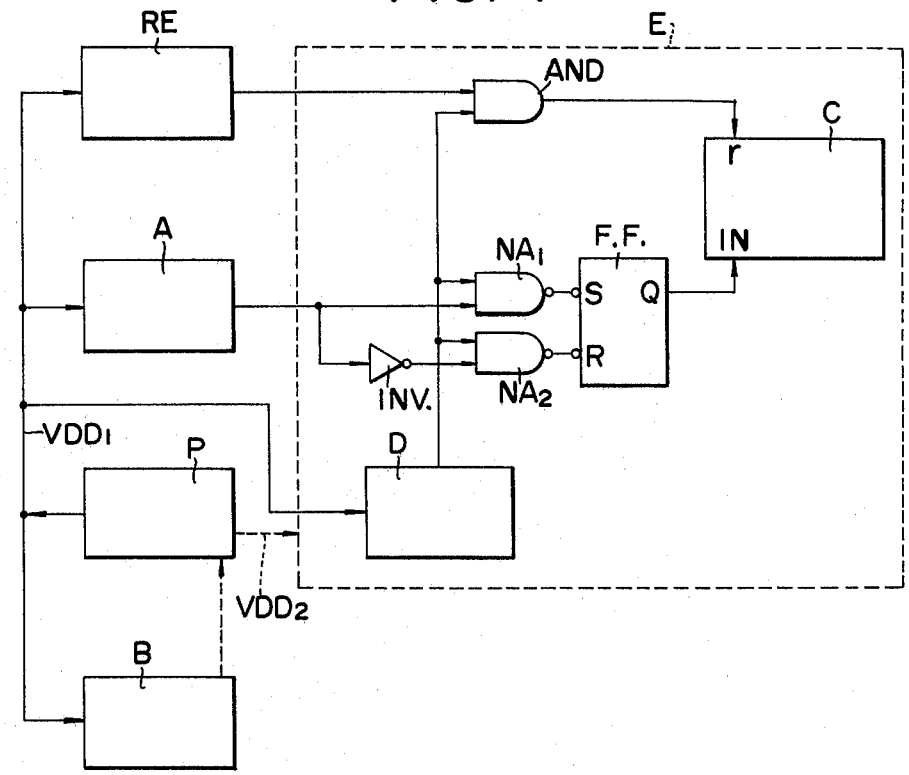

United States Patent [19]

Ohsako et al.

[11] 4,085,311
[45] Apr. 18, 1978

[54] MEMORY DEVICE WITH ERROR PREVENTION OF DATA DURING POWER FAILURE

[75] Inventors: Kyoichi Ohsako, Tokyo; Katusuke Yamashita, Matsudo, both of Japan

[73] Assignee: Laurel Bank Machine Co., Ltd., Tokyo, Japan

[21] Appl. No.: 659,710

[22] Filed: Feb. 20, 1976

[30] Foreign Application Priority Data

Feb. 27, 1975 Japan ............................. 50-24300

[51] Int. Cl.$^2$ ..................... G06M 3/12; G07D 9/00
[52] U.S. Cl. ........................ 235/92 FP; 235/92 CN; 365/195; 365/229
[58] Field of Search ............... 340/172.5, 173 R; 235/92 SB, 92 FP, 92 MS, 1.53 R, 1.53 A; 307/64, 217, 215, 247 R; 317/31, DIG. 5

[56] References Cited

U.S. PATENT DOCUMENTS

| | | | |
|---|---|---|---|
| 3,145,342 | 8/1964 | Hill | 307/217 |
| 3,602,910 | 8/1971 | Kofsky | 340/173 FF |
| 3,870,901 | 3/1975 | Smith et al. | 340/173 FF |
| 4,005,409 | 1/1977 | Fever | 235/92 FP |

FOREIGN PATENT DOCUMENTS

1,322,869   7/1973   United Kingdom ........... 235/92 FP

Primary Examiner—Stuart N. Hecker
Assistant Examiner—Donald McElheny, Jr.
Attorney, Agent, or Firm—Cameron, Kerkam, Sutton, Stowell & Stowell

[57] ABSTRACT

Memory device including an input circuit adapted to provide signal pulses to be applied to an IC counter so that they are counted by the counter. Auxiliary power source is provided to supply the power circuit in the counter to maintain the memory therein despite interruption of power supply. A set-and-reset type flip-flop circuit is provided between the input circuit and the counter in such a manner that the signal pulses are applied directly to one of the set and reset terminals and through an inverter to the other of the terminals. The arrangement is effective to prevent counting error which may be experienced during interruption of power supply.

4 Claims, 2 Drawing Figures

MEMORY DEVICE WITH ERROR PREVENTION OF DATA DURING POWER FAILURE

The present invention relates to memory devices and more particularly to safety means for maintaining memories operative even under adverse conditions such as, for example, an inadvertent voltage drop in the electric power source. More specifically, the present invention pertains to memory devices which are particularly suitable to be used in money counting machines, although it is not limited to such applications.

Conventionally, in order to maintain such data of relatively small bit number, such as in money counting machines, use has been made of electromechanical memory devices which include mechanical memory devices having a mechanical memory member adapted to be actuated by an electro-magnetic actuator in accordance with input count signals. This type of memory has been found advantageous in that the memory can be maintained even under an inadvertent voltage drop in the power source, but have inherent disadvantages in that response is relatively slow and often have mechanical troubles. It is of course possible to employ a core-memory device for the purpose, however, disadvantages will inherently be experienced because core memories require complicated circuits which will therefore increase costs involved.

It may therefore be advantageous to employ an IC memory counter in money counting machines. For that purpose, the counter may be connected with an input circuit in such a manner that it receives input signal pulses which correspond in number to counted number of coins from the input circuit and produces signals which are representatives of the count. In order to prevent the counted data from being destroyed when the power source voltage is dropped for example due to power stoppage or failure of the power source, an auxiliary power supply may be provided so as to maintain supply of electricity to the power circuit in the counter whereby the state of the counter is maintained as it is.

This arrangement is effective to maintain the memory of count in the counter during power failure but has been found as having a further problem in that the counter may conduct incorrect operation due to noise which may possibly be produced when power supply from the main power source is recovered.

The present invention has therefore an object to provide novel memory devices having IC memory counter means.

Another object of the present invention is to provide electrically operated memory devices which can maintain count memories even under interruption of power supply and can avoid incorrect counting when the power supply is recovered after a certain interruption thereof.

Still further object of the present invention is to provide memory counting devices which are particularly suitable for use in money counting machines.

According to the present invention, the above and other objects can be accomplished by a memory device comprising input circuit means adapted to provide input signal pulses, at least one IC counter having an input section and a reset section, bi-stable set and reset type switching means having an output section connected with the input section of the IC counter as well as a set and a reset terminals, power source voltage sensing means for providing an output signal when power source voltage is decreased below a predetermined value, first gate means connected with the sensing means and said input circuit means and having an output connected with one of the set and reset terminals of the switching means, second gate means connected with the sensing means and with said input circuit means through inverting means, said second gate means having an output connected with the other of the set and reset terminals of the switching means, one of said first and second gate means being adapted to allow a switching signal to pass to the associated one of the set and reset terminals of the switching means when an input signal is received from the input circuit and when the output signal is not applied thereto from the power source voltage sensing means, the other of said gate means being adapted to allow a switching signal to pass to the other of the set and reset terminals when an input signal is not produced in the input circuit means and when the output signal is not applied thereto from the power source voltage sensing means, whereby both of said gate means are closed when the output signal is applied to the gate means from the sensing means due to a decrease in the power source voltage, auxiliary power supply means being provided for maintaining supply of electrical power to the IC counter, the switching means and the gate means when there is a decrease in the power source voltage. Reset means may additionally be provided and connected with the reset section of the IC counter through third gate means which is also connected with said power source voltage sensing means and adapted to allow a reset signal to pass to the IC counter when a signal is received from the reset means and the output signal is not applied thereto from the power source voltage sensing means. In accordance with the present invention, all of the three gate means are closed when there is a decrease in the power source voltage to interrupt any state-changing pulse from being applied to any of the switching means and the IC counter, while auxiliary power supply is maintained to keep the states of the gate means, the switching means and the IC counter at the positions when the main power supply is interrupted. When the main power supply is recovered, the counting device continues its operation without producing any error signal.

Figure 2:
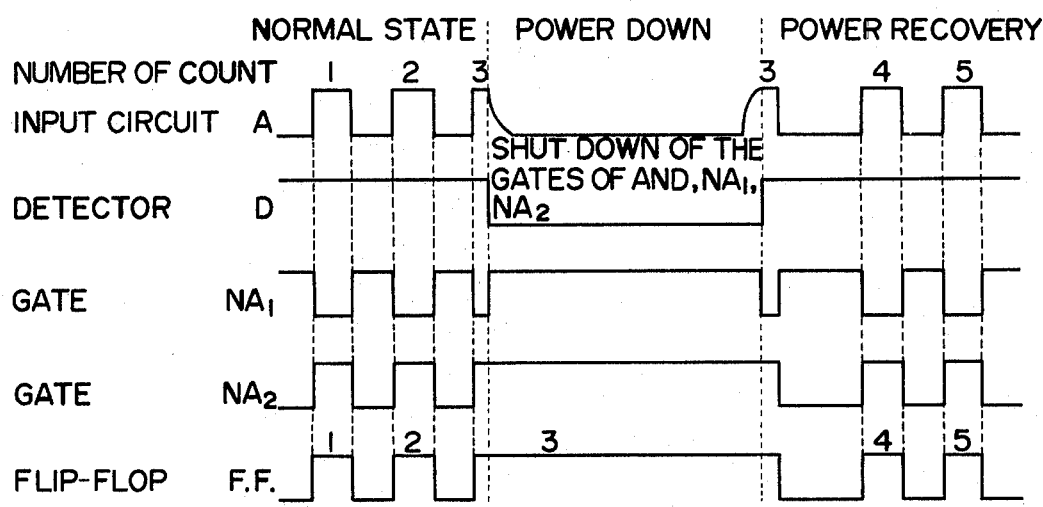

The above and other objects and features of the present invention will become apparent from the following descriptions of a preferred embodiment taking reference to the accompanying drawings, in which:

FIG. 1 is a block diagram showing the electric circuit embodying the features of the present invention; and FIG. 2 is a diagram showing signal forms in various stages of the circuit.

Referring to the drawing, particularly to FIG. 1, the counting device shown therein includes an IC counter C which has an input section IN and a reset section $r$. By applying signals to the input section IN, the counter C conducts counting operation and, by applying a signal to the reset section $r$, the counter C is brought into an original or null position. The device also includes an input circuit A which is connected with a main power supply P through a line $VDD_1$ and, in the particular embodiment, provides signal pulses which corresponds to the counted number of coins. For this purpose, the input circuit A may include a proximity switch adapted to detect the number of coins which are passed through an appropriate passage in a coin counting machine.

If the input circuit A is so connected with the IC counter C that the circuit A applies the signal pulses directly to the input section of the counter C, counting error may be produced during inadvertent interruption of the main power supply. For example, if the main power supply is interrupted when the input circuit A is producing a high level signal, the operation of the counting device may be started again with a high level signal in the input circuit A when the main power supply is restored. This will cause a counting error which must be carefully avoided.

According to a feature of the present invention, in order to avoid the above problem, a switching circuit is provided between the input circuit A and the counter C. In the illustrated embodiment, the switching circuit is constituted by a flip-flop circuit F.F. having a reset terminal R, a set terminal S and an output terminal Q. The input circuit A is connected through a NAND gate $NA_1$ with the set terminal S of the flip-flop circuit F.F. and through an inverter INV and a NAND gate $NA_2$ with the reset terminal R of the flip-flop circuit. The output terminal Q is connected with the input section IN of the counter C. A reset circuit RE is connected through an AND gate AND with the reset section r of the counter C.

There is also provided a power supply voltage detector D which produces a high level signal when the voltage from the main power supply P is above a predetermined value but provides a low level signal when the voltage is decreased below the predetermined value. The signal from the detector D is applied to the NAND gate $NA_1$ and $NA_2$ together with the signals from the input circuit A. Further, the signal from the detector D is also applied to the gate AND.

An auxiliary power supply such as a battery B is provided to provide a power supply to the power circuits in the gates AND, $NA_1$ and $NA_2$, as well as those in the flip-flop circuit F.F. and the counter C through a line $VDD_2$ when the voltage from the main power supply is decreased below the predetermined value.

In normal operation when there is a power supply of an adequate voltage, a high level signal is applied from the detector D to the gates AND, $NA_1$ and $NA_2$. When a low level signal is being produced in the input circuit A, there are a high level output signal from the gate $NA_1$ and a low level output signal from the gate $NA_2$. Thus, the flip-flop F.F. is in the reset position wherein a low level signal is supplied to the counter C.

When a high level signal pulse is produced in the input circuit A as shown in FIG. 2, the gate $NA_1$ is opened so that a low level output appears therefrom while the gate $NA_2$ is closed to produce a high level signal pulse as shown. Thus, the flip-flop circuit A is brought into a set position to have a high level signal pulse passed to the counter C.

When there is an inadvertent decrease in the main power supply voltage, a low level signal is applied from the detector D to the gates AND, $NA_1$ and $NA_2$ to close them. At the same time, the auxiliary power supply B is connected to the power circuits in these gates as well as those in the flip-flop circuit F.F. and the counter C so as to maintain these components in those positions when they have been at the time of power down.

According to the arrangement of the present invention, it is possible to avoid any counting error which may possibly be experienced in conventional arrangements when there is a sudden decrease in the main power supply voltage during such a period in which a high level signal pulse is being produced at the input circuit.

Referring to FIG. 2, it will be seen that, if there is a voltage decrease in the main power supply P when the output signal pulse is being produced in the input circuit A, the signal level will be decreased and again restored during a recovery of the power supply producing a further or extra pulse. However, throughout the power down period, the flip-flop circuit F.F. is maintained in the position where it has been when the power down has taken place so that the extra pulse produced in the input circuit A is prevented from being transmitted to the counter C.

The invention has thus been shown and described with reference to a specific embodiment, however, it should be noted that the invention is in no way limited to the details of the illustrated arrangements but changes and modifications may be made without departing from the scope of the appended claims.

We claim:

1. Memory device comprising input circuit means adapted to provide input signal pulses, at least one IC counter having an input section and a reset section, bi-stable set and reset type switching means having an output section connected with the input section of the IC counter, said bi-stable switching means having a set and a reset terminal, power source voltage sensing means for providing a low output signal when power source voltage is below a predetermined value, and a high output signal when power source voltage is above a predetermined level, first gate means having one input connected with the sensing means and another input connected with said input circuit means and having an output connected with one of the set and reset terminals of the switching means, second gate means having one input connected with the sensing means and another input connected with said input circuit means through inverting means, said second gate means having an output connected with the other of the set and reset terminals of the switching means, one of said first and said second gate means being adapted to pass a switching signal to the associated one of the set and reset terminals of the switching means when an input signal is received from the input circuit and when the output signal is not applied thereto from the power source voltage sensing means, the other of said gate means being adapted to pass a switching signal to the other of the set and reset terminals when an input signal is not produced in the input circuit means and when the output signal is not applied thereto from the power source voltage sensing means, whereby both of said gate means are closed when the output signal is applied to the gate means from the sensing means due to a decrease in the power source voltage, auxiliary power supply means connected to the IC counter, the switching means and the gate means for maintaining a supply of electrical power thereto when there is a decrease in the power source voltage.

2. Memory device in accordance with claim 1 which further comprises reset means connected with the reset section of the IC counter through one input of third gate means which is also connected at another input with the output of the sensing means in such a manner that it passes a reset signal to the IC counter when a signal is received from the reset means and a high output signal is applied thereto from the power source voltage sensing means.

3. Memory device in accordance with claim 1 in which said switching means is a flip-flop circuit.

4. Memory device in accordance with claim 3 in which said first and second gate means are NAND gates.

* * * * *